United States Patent [19]
Foucher et al.

[11] Patent Number: 5,174,748
[45] Date of Patent: Dec. 29, 1992

[54] CHAMBER HAVING A HOT ZONE AND A COLD ZONE AND AT LEAST ONE GAS INLET TUBE

[75] Inventors: Claude Foucher, Plaiseau; José Maluenda, Boissy-St.Leger, both of France

[73] Assignee: U.S. Philips Corp., New York, N.Y.

[21] Appl. No.: 757,097

[22] Filed: Sep. 10, 1991

[30] Foreign Application Priority Data

Sep. 21, 1990 [FR] France .................. 90 11666

[51] Int. Cl.⁵ .................. F27D 19/00; F27D 5/00
[52] U.S. Cl. .................. 432/41; 432/253; 432/64; 432/202
[58] Field of Search .......... 432/5, 6, 152, 2, 253, 432/41, 42, 64, 65, 242

[56] References Cited

U.S. PATENT DOCUMENTS

| | | | |
|---|---|---|---|
| 2,688,094 | 8/1954 | Dumond | 250/53 |
| 4,955,808 | 9/1990 | Miyagawa | 432/253 |
| 4,958,363 | 9/1990 | Nelson et al. | 378/85 |
| 4,976,612 | 12/1990 | Adams | 432/253 |
| 4,992,044 | 2/1991 | Philipossian | 432/253 |
| 5,118,286 | 6/1992 | Sarin | 432/41 |

*Primary Examiner*—Henry C. Yuen
*Attorney, Agent, or Firm*—Ernestine C. Bartlett

[57] ABSTRACT

A reactor (100) is provided which comprises an enclosure (1,2,3) which has along its longitudinal axis (4—4') a hot zone (1), a cold zone (2) and between the hot and the cold zone an intermediate zone (3) and which has at least one gas inlet tube (12,32). The reactor further comprises a heat-insulating plug (30) for being positioned in the intermediate zone (3) to prevent a gas-flow from the hot zone (1) to the cold zone (2) of the enclosure (1,2,3) and coupling means (13,102;33,36) for transmitting gas from the gas inlet tube (12;32) into the hot zone (1). The use of the heat insulating plug (30) prevents deposition of unwanted material on the walls of the cold zone (2) of the reactor.

7 Claims, 3 Drawing Sheets

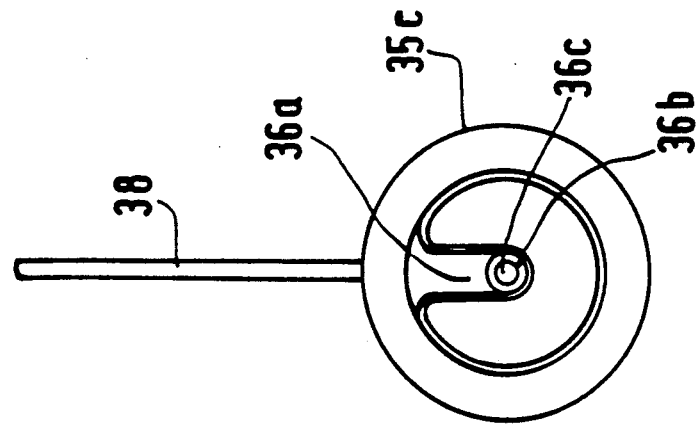
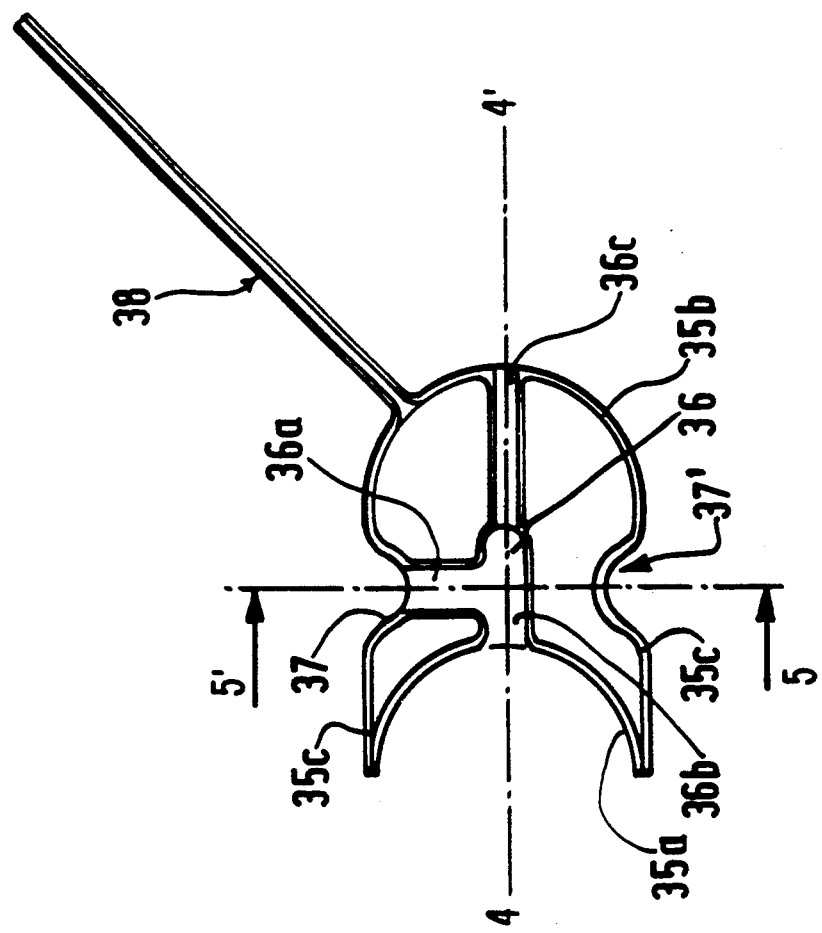

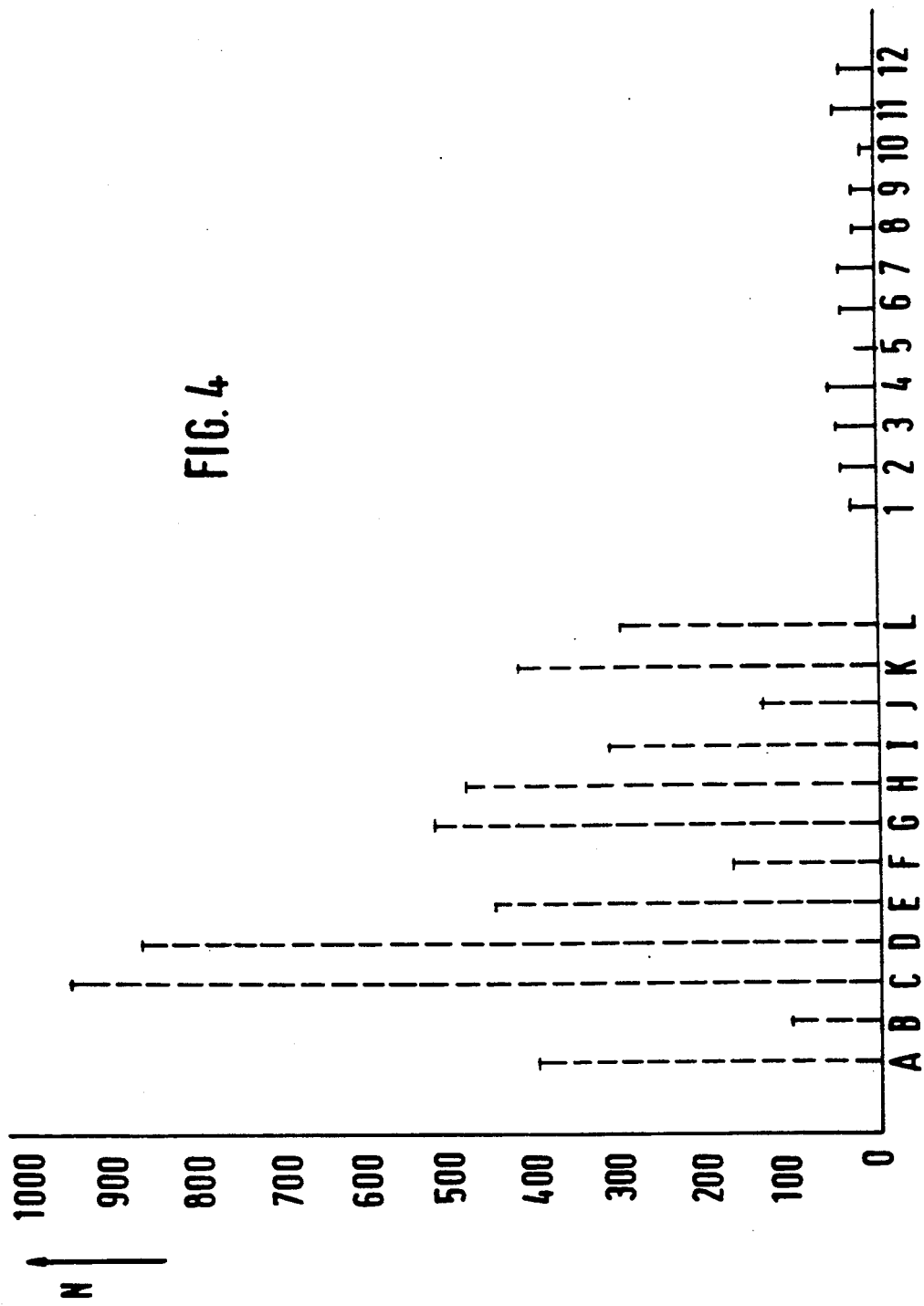

CHAMBER HAVING A HOT ZONE AND A COLD ZONE AND AT LEAST ONE GAS INLET TUBE

FIELD OF THE INVENTION

The invention relates to a reactor comprising an enclosure which has along its longitudinal axis a hot zone, a cold zone and, between the hot and the cold zone, an intermediate zone, and which has at least one gas inlet tube.

The reactor may be used for carrying out heat treatments on semiconductor devices, particularly in the realization of semiconductor devices of the elements of Groups III-V.

BACKGROUND OF THE INVENTION

A reactor chamber as mentioned above is known from European Patent Application EP-247 680, which corresponds substantially to U.S. Pat. No. 4,748,135. Its enclosure has, besides a sample support for a substrate to be treated, a device for introducing gases directly into the hot zone where the sample support is positioned. This device consists of several cylindrical concentric tubes of which the innermost tube issues into one (or several) intermediate tube(s) which issue(s) in its (their) turn into the outermost tube. The latter then ends in the vicinity of a substrate which is to be treated.

The cited application deals exclusively with the problem of introducing the gases into the hot zone of a vapor phase epitaxy reactor.

The problems involved in epitaxial growth in the vapor phase are of a particular nature. On the one hand, the number of samples treated at one time is small. The reactor chambers are accordingly of a small volume.

The problems involved in epitaxial growth are not the same as the problems involved in the heat treatment of wafers of semiconductor material. It should first be realized that the manufacture of integrated circuits comprises steps, such as those of ion implantation, which must be followed by heat treatments at elevated temperatures.

Now certain semiconductor materials, among them the materials of the III-V group, are subject to a change in their surface condition by decomposition when they are brought to the temperatures necessary for carrying out these heat treatments. A solution to this problem consists in a heat treatment which is carried out under a flow of a gas which prevents the change in the surface condition. For example, it is necessary to expose the samples to a flow of arsenic for carrying out the heat treatment of materials for integrated circuits on gallium arsenide. This flow is obtained by cracking of arsine ($AsH_3$) at elevated temperature in the hot zone of the enclosure of the reactor while the heat treatment is carried out.

The use of gases such as arsine in heat treatments, however, causes a number of problems arising from the characteristics of these gases.

The principal problem lies in the fact that gases obtained in this way by decomposition at high temperature subsequently condense in the cold zones of the chamber on the walls. Such cold zones exist on either side of the hot zone, at either end of the heat-treatment chamber.

Also at the end of the heat treatment, when the sample support is removed from the chamber by translation, for example by means of a rod, the samples necessarily pass through a cold zone in the proximity of the walls polluted by deposition owing to this condensation.

It has thus been found in practice that samples of gallium arsenide of 2 or 3 inches (approximately 5 and 7,5 cm, respectively) diameter could receive more than 20.000 particles per sample.

These deposits of particles owing to the pollution of the cold walls of the heat-treatment chambers are extremely disadvantageous. In fact, they modify to a great extent, unfavorably, the performance of the integrated circuits. They take place on samples which have already been processed for a long time, thus at a stage of manufacture where they have achieved a cost level which is far from negligible. They take place on numerous samples at a time, since the heat treatments are carried out on groups of some fifty samples. In addition, they lead to a spread in the performance of the samples, which thus become less reliable.

Moreover, these deposits remain in the chambers at the end of the heat treatments. It is necessary, therefore, to decontaminate the walls. It is obvious that the samples as well as the contaminated walls constitute a danger for the operators who run the risk of involuntarily inhaling the polluting particles during the final treatment of the samples or during the decontamination treatment of the chamber walls. Especially in the case of, for example, arsine, these polluted particles are highly toxic.

Moreover, the decontamination operation on the chamber walls between each heat treatment is lengthy and costly in terms of manufacturing time.

It is found, accordingly, that the problems involved in the heat treatment of samples under a flow of gases obtained from the decomposition at elevated temperature of polluting compounds capable of condensing at a lower temperature are quite different from those involved in the realization of epitaxial layers. It can be ascertained that these problems gain importance in proportion as the number of samples is higher, the heat-treatment chambers have a greater volume, the quantities of gas involved are greater, the treatment temperatures are higher, and the gases are more toxic.

On the other hand, in other fields of technology where the object is to realize a coating on walls of one portion of an enclosed space to the exclusion of walls in another portion, problems arise when the coating material must be introduced in the form of a gas in obtaining the proper separation between the portion where the coating is to be made and the portion through which the gas is introduced.

SUMMARY OF THE INVENTION

According to the invention, the various problems described are resolved when a reactor as described in the opening paragraph is characterized in that the reactor further comprises a heat-insulating plug which may be positioned in the intermediate zone to prevent a gas-flow from the hot zone to the cold zone of the enclosure and coupling means for transmitting gas from the gas inlet tube into the hot zone. The reactor may be used as a heat treatment reactor in this way, while the possibilities of polluting deposits being formed in the cold zone are eliminated, as are the dangers to the operator when the gases are transmitted through the coupling means towards the hot zone. The enclosure may alternatively be used as an enclosure in which a coating of the walls is to be carried out, in which case the plug effectively separates the region to remain without coating from the region which must receive the coating.

BRIEF DESCRIPTION OF THE DRAWINGS

The invention will be described in more detail below with reference to the annexed Figures, in which:

FIG. 2 shows in a section along the same axis the heat-insulating plug only;

FIG. 3 shows the same plug in diagrammatic cross-section taken on the line 5—5' in FIG. 2 and;

FIG. 4 shows a comparison of the numbers of contaminating particles on wafers which have undergone a heat treatment in a chamber according to the invention and in a chamber not provided with means according to the invention.

DETAILED DESCRIPTION OF THE PREFERRED EMBODIMENTS

Figure 1:
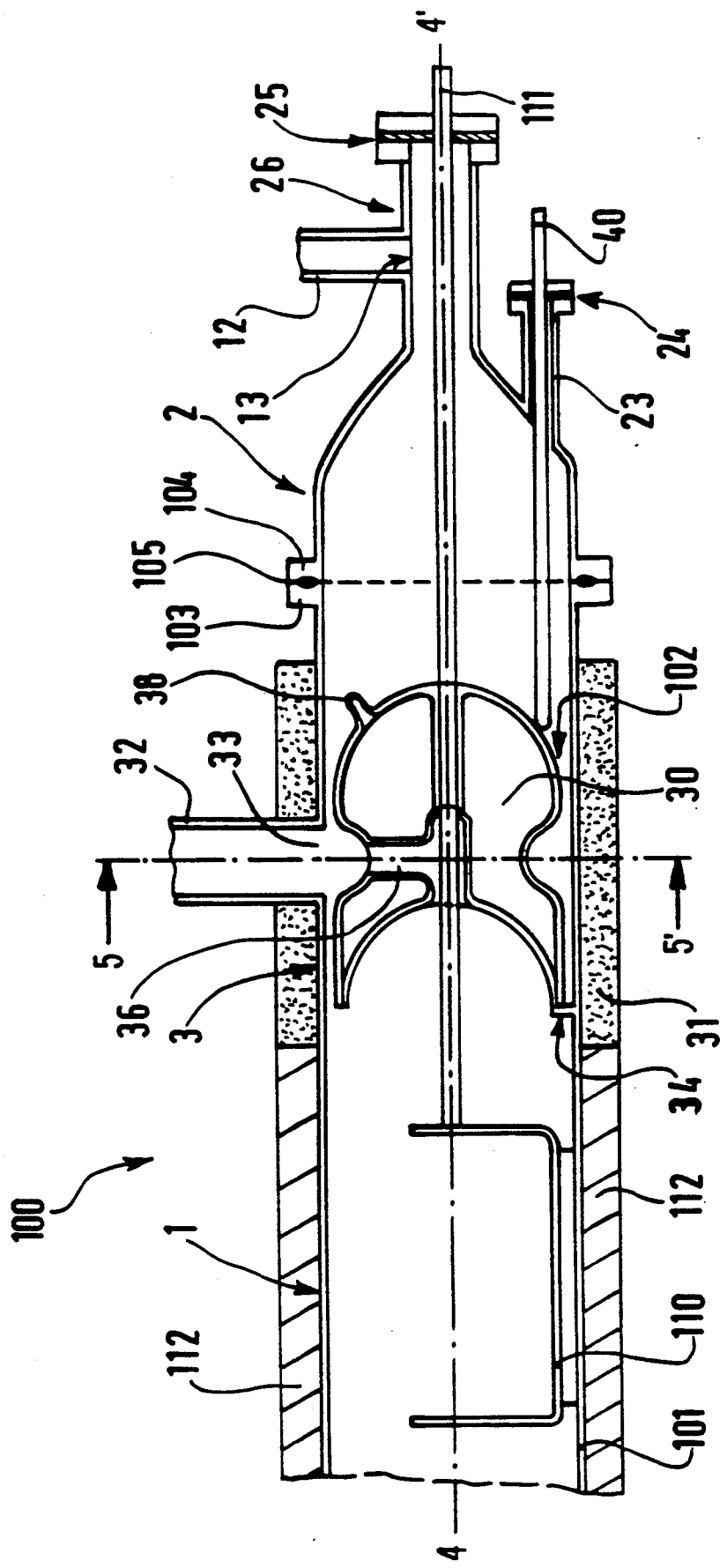
FIG. 1 is a diagrammatic longitudinal section of a chamber provided with a heat-insulating plug with two inlets for gases and provided with a sample support holder.

FIG. 1 shows in diagrammatic longitudinal section a reactor 100 which can be used in a manufacturing process for semiconductor devices, especially as a heat treatment chamber for semiconductor devices comprising elements of the III-V group comprising the elements arsenic (As) and gallium (Ga).

Its enclosure 1, 2, 3 has a great dimension measured parallel to the longitudinal axis 4—4' and smaller dimensions measured transversely.

Throughout the following description, it will be considered preferable for carrying out the invention if the enclosure is cylindrical, i.e. that it has a circular cross-section perpendicular to the plane of FIG. 1, of a small diameter compared with the longitudinal dimension taken on 4—4'.

The enclosure has a first portion 1 or hot zone, which is brought to elevated temperatures by a heating system 112 which will not be described in any detail as it is known to those skilled in the art.

The enclosure comprises, seen in the direction of the longitudinal axis 4—4', a zone 2 which is called cold zone since it is not provided with heating means. The cold zone 2 is, for example, at ambient temperature.

Between the zone 1 and the zone 2 is situated the intermediate zone 3 where the temperature is between those of the hot and cold zones.

Preferably, the intermediate zone 3 is thermally insulated to keep its temperature as constant as possible, for example, by means of an insulating sleeve 31 disposed around the walls 101 of the chamber in this region 3.

In the intermediate region 3 is provided a tube 32 which issues in the wall 101 of the chamber with orifice 33. The tube 32 and the orifice 33 have the same cross-sectional surface area.

In the process of carrying out a heat treatment on semiconductor devices comprising elements of the III-V group, an arsine gas (AsH$_3$) is introduced through the tube 32 at ambient temperature, or a mixture of arsine gas and a neutral gas, for example, hydrogen.

To prevent changes taking place in the surface condition of semiconductor devices, which changes are the result of heat during the heat treatment, this heat treatment is carried out under an arsenic atmosphere (As), which is obtained by cracking of arsine at the heat-treatment temperature and in appropriate quantities.

The arsine must accordingly be transported through the inlet tube 32 to the hot zone 1 of the enclosure.

On the other hand, the arsenic formed must not be given the opportunity to deposit on cold walls where it will condense, forming a polluting layer consisting of particles which will subsequently be deposited on the samples, after the heat treatment, when these samples are taken from the reactor and must necessarily pass through the cold zone.

During a heat treatment operation including the presence of a polluting gas such as the arsenic obtained by cracking of the arsine, therefore, a heat-insulating plug 30 is positioned in the intermediate zone 3 to prevent condensation of the gases present in the hot zone 1 on the walls of the chamber in the cold zone 2 and thus a gas-flow from the hot zone 1 to the cold zone 3.

The heat-insulating plug 30 is thus positioned in the region of the orifice 33 of the tube 32 and is placed in this position by means of a stop 34 to which its surface 35a will be applied.

The heat-insulating plug 30 is provided with a tubular opening 36 to render possible the transmission of the gas introduced through the tube 32 towards the hot zone 1 of the chamber.

This tubular opening 36, shown in FIG. 2 which is a longitudinal section of the plug 30 taken on the line 4—4', has a first, substantially radial portion 36a, and a second substantially axial portion 36b, i.e. parallel to the axis 4—4', and at the same time substantially centered in the cross-section of the plug, as is shown in FIG. 3 which is a cross-section taken on the line 5—5' in FIG. 2.

The position of the radial portion 36a of the tubular opening is so arranged that the orifice 37 of the radial portion 36a at the external surface of the plug 30 coincides with the orifice 33 of the tube 32 of the chamber when the plug is in position against the stop 34.

Thus the gas introduced through the tube 32 into the tubular portion 36a enters the hot zone 1 of the chamber through the tubular portion 36a, and the products of the cracking which takes place in the hot zone 1 cannot pollute the cold zone 2, the latter being insulated by the heat-insulating plug 30.

Nevertheless, there exists between the external walls of the plug 30 and the internal walls of the intermediate zone 2 a small interspacing 102 necessary for allowing the plug to slide against the stop 32. When highly polluting, highly toxic and dangerous reacting gases are used, such as arsine, it is considered that the interspacing 102 is still too great an escape opening, and that the reaction gases are capable of entering the cold zone 2 through this escape opening still in an excessive quantity in spite of the presence of the plug. Therefore, it is ensured that a non-reacting gas, for example, hydrogen, is also introduced into the chamber, serving as a vector gas. This gas is to be propelled through the interspacing 102 in the same direction as the reaction gas in order to act as a non-return mechanism.

To this end, see FIG. 1, there is in the cold zone 2 a tube 12 which issues into the chamber by an orifice 13 formed in the wall 101.

Thus with the plug positioned against the surface 34, the gases introduced through the tubes 32 and 12 penetrate through the channels 36 and 102, respectively, into the utilization zone, here the hot zone 1.

The sum of the cross-sections of the channels 36 and 102 is substantially equal to the sum of the cross-sections of the gas inlet tubes 32 and 12 so as to avoid turbulences during the gas flow and so that the vector gas introduced through the channel 102 produces a non-return effect.

The reactor 100 can be opened at the level of the rims 103-104 for the introduction of the various elements necessary for carrying out the integrated circuit manufacturing processes, such as a sample support holder 110, or the plug 30. The hermetic closure of the chamber in the state in which it is ready for the heat treatment operation, for example, is obtained by having the rims 103-104 move towards one another around an annular seal 105.

The plug 30 is put into position by a sliding movement inside the cold zone 2 of the chamber up to the surface of the stop 34. This sliding movement is facilitated in particular by the existence of the interspacing 102, which no longer presents a danger since the propulsion of a gas with a non-return function is provided.

A rod 40 coupled to the surface 35b, the rear surface of the plug 30, is provided for manipulating said plug when the chamber is closed by the closing system 103, 104, 105. This rod is prolonged to outside the chamber, from which it projects through a conventional sealing bush 24.

Preferably, the sealing bush 24 is disposed in a tube 23 which is parallel to the longitudinal axis 4—4'. The rod 40 coupled to the plug 30, the tube 23 and the plug 30 are aligned. The sliding movement of the plug 30 in the cold zone 2 of the chamber and its positioning against the stop in the intermediate portion 3 are thus facilitated, owing to the presence of the rod 40 which can be manipulated from outside the chamber.

For the application in which semiconductor devices are manufactured, the chamber must be positioned in such a way that the longitudinal axis 4—4' is horizontal. Moreover, it must be provided with a sample support, and preferably this sample support will be a holder 110 capable of containing some fifty wafers, which are then in vertical position, for the application in which wafers of semiconductor material are subjected to a heat treatment.

The support 110 is coupled to a rod 111 in order to be manipulated after being inserted by the device 103, 104, 105. This rod is sufficiently long for reaching the exterior of the chamber when the support is in position in the hot zone 1. Moreover, the rod 111 is parallel to the longitudinal axis 4—4'. At its end which is not coupled to the support, the rod 111 issues from the chamber through a conventional sealing bush 25 at the end of the tube 26 of the chamber disposed parallel to the axis 4—4'.

The inlet tube 12 for the carrier gas may be provided in the longitudinal walls of this end tube 26.

Thus the support 110 may be easily moved by means of the rod 111 coupled thereto in the chamber when the latter is closed by the device 103, 104, 105.

In the case in which such a support is present, the rod 40 for positioning the plug 30 is preferably not integral with the plug, whereas the rod 111 coupled to the support 110 is integral with the support. To put the elements in position, accordingly, the support is first inserted, then a pressure is exerted on the plug by means of the rod 40, which is then moved back again, but without pulling it out completely. Then, to have the elements leave the chamber, it is sufficient to exert a pulling force on the rod 111 which is integral with the support. This movement renders it possible to recuperate the plug 30 and the support 110 simultaneously.

In a preferred embodiment of the invention for the application in which semiconductor devices are processed, the chamber 100 is made of quartz, as is the plug 30.

The tubes 32 and 12 are also made of quartz, as are the rods 111 and 40.

If the plug 30 is to be made of quartz and to achieve its thermal insulating qualities, this plug will comprise quartz walls 35c parallel to the axis 4—4' and walls 35a and 35b substantially perpendicular to the axis 4—4'. The wall 35a is called front wall, i.e. it faces the sample support holder, while the wall 35b is called rear wall, i.e. it is coupled to the displacement means for the plug formed by the rod Preferably, the walls 35a and 35b of the plug are spherical in order to avoid gas turbulence, the concave portion facing towards the support, i.e. towards the interior of the hot zone of the chamber, and the convex portion facing towards the exterior or cold zone of the chamber.

The tubes 36a, 36b, 36c are quartz tubes connected to walls 35c, 35a and 35b, respectively. The thermal insulating property is then obtained by creating a vacuum in the internal portion of the plug, which is hollow, for example through an exhaust tube 38 which is subsequently formed and whose length is reduced in order to render possible the eventual insertion of the plug into the chamber.

FIG. 2 shows that the heat-insulating plug 30 is also cylindrical for its application in a cylindrical quartz chamber, the external diameter being slightly smaller than the internal diameter of the chamber in order to preserve the interspacing 102 with an annular cross-sectional area $S_2$, which permits it to slide in the chamber.

A slight throat or narrowing 37' is preferably provided for the transition between the orifice 37 of the tube 36a and the wall 35c of the plug.

When a heat treatment is carried out in the reactor on integrated circuits of Group material, comprising arsenic and gallium in a flow of arsine, the temperature in the hot zone 1 for the heat treatment itself and cracking of arsine is of the order of 850° C., i.e. between 700° C. and 1000° C. The temperature of the intermediate zone 3 then is between 270° C. and 330° C., preferably 300° C. The cold zone 2 is at ambient temperature. The temperature difference between the hot and the cold zone is great.

Thus the arsenic obtained by cracking of the arsine in the hot zone 1 is not deposited on any of the chamber portions where the sample support holder 110 may be made to pass when it is extracted from the chamber through the opening of the device 103, 104, 105.

In an alternative embodiment of the invention a deposit is to be provided on the walls of a zone of the enclosure, for example a cylindrical, of any material for example by cracking of a gas mixture, to the exclusion of the walls of another zone. In that case, a plug as described above, which need not necessarily be provided with the duct 36, but solely with the interspacing 102, is positioned in such a way as to obstruct the end of the enclosure to be protected from the deposition. The gas is then introduced through this latter portion, which accordingly remains without deposit, and passes through the interspacing 102 of the plug towards the second zone where it is cracked and the decomposition products are deposited on the walls. The invention thus is applicable directly in the preparation of tubular quartz crucibles used in metallurgy for Group II-VI materials such as, for example, CdTe, which crucibles require a coating of carbon obtained from cracking of methane at high temperature.

On the one hand, the deposit must be homogeneous, while on the other hand the transition must be abrupt at an exact location of the crucible in order to achieve a zone which is absolutely free of a deposit, where the final sealing of the assembly is effected before the crystal growth of the Group II-VI material by the Bridgman method is carried out.

When the reactor according to the invention is used for heat treatments under arsine, or any other gas which is both a pollutant for the samples and toxic for the operator, it is no longer necessary to decontaminate the cold zones. In addition, the number of residual polluting particles found on the samples themselves is considerably diminished, as is shown in FIG. 4. FIG. 4 shows a summary of the rate of contamination measured by means of an analyzer of the number of particles on wafers of two inches in diameter (approximately 5 cm). Each measurement corresponds to the average value per heat treatment of the number N of particles found on a group of approximately forty wafers of Group III-V semiconductor material. The values of the number N of particles found on 12 groups of wafers after treatment in a chamber according to the invention are given in full lines (the groups are given the reference numerals 1 to 12). The values of the number N of particles found on the groups of wafers after treatment in a chamber without the means according to the invention are shown in broken lines, the groups having the reference numerals A to L. It can be seen that on average the contamination rate is reduced by a factor 10.

The health of the operator is better protected in this way. The industrial manufacturing process of semiconductor circuits, moreover, is rendered more simple, rapid and much less expensive in that a delicate decontamination operation is rendered superfluous.

Simple means may be coupled to the chamber in order to avoid the contamination of its end through which the gases are removed. In fact, the problem of the contamination of the cold zone, which is resolved according to the invention, is mainly difficult to resolve because of the fact that a removal device for the sample support holder is to be provided in this zone. At the other end of the chamber, the problem is of a different nature, and is not dealt with here since it does not form part of the present invention as such.

We claim:

1. A reactor comprising an enclosure which has along its longitudinal axis a hot zone, a cold zone and between the hot and the cold zone an intermediate zone and which has at least one gas inlet tube, wherein the reactor further comprises a heat-insulating plug (30) for being positioned in the intermediate zone (3) to prevent a gas-flow from the hot zone (1) to the cold zone (2) of the enclosure (1,2,3) and coupling means (13,102;33,36) for transmitting gas from the gas inlet tube (12;32) into the hot zone (1).

2. A reactor as claimed in claim 1, wherein the coupling means comprise a gas inlet (12,13) in the cold zone (2) and an interspacing (102) between longitudinal walls of the intermediate zone (3) and the heat-insulating plug (30) through which gas can flow from the cold zone (2) to the hot zone (1).

3. A reactor as claimed in claim 1, wherein the coupling means comprise a gas inlet tube (12) in a longitudinal wall of the intermediate zone (3) and a tubular opening (36) in the plug (30) which has a radial portion (36a) facing towards an external longitudinal wall (35c) of the plug an axial portion (36b) extending along the longitudinal axis 4—4') of the enclosure and of the plug (30) towards the hot zone (1); and said means comprise in addition a stop (34) for securing the plug (30) in a position in which the radial portion (36a) of its tubular opening (36) is aligned with the gas inlet tube (12).

4. A reactor as claimed in claim 1, wherein the external, non-sliding walls (35a, 35b) of the plug (30) are spherical, the convexity facing towards the cold zone (2).

5. A reactor as claimed in claim 4, wherein the plug (30) has a hollow internal portion delimited by its external walls (35a, 35b, 35c) and the walls of its tubular openings (36a, 36b, 36c) in which internal portion a vacuum is effected.

6. A reactor as claimed in claim 5, wherein the plug (30) is made of quartz.

7. A reactor as claimed in claim 6, wherein the sum of the cross-sectional surface areas of the gas-inlet tubes (12,32) equals the sum of the surface areas of the interspacing (102) and the tubular opening (36) in the plug (30).

* * * * *